United States Patent [19]

Halse

[11] Patent Number: 5,570,018
[45] Date of Patent: Oct. 29, 1996

[54] METHOD OF AND APPARATUS FOR OBTAINING SPATIAL NMR INFORMATION

[75] Inventor: Roger M. Halse, Beltinge, England

[73] Assignee: British Technology Group Limited, London, England

[21] Appl. No.: 244,490

[22] PCT Filed: Jan. 12, 1993

[86] PCT No.: PCT/GB93/00052

§ 371 Date: Jun. 2, 1994

§ 102(e) Date: Jun. 2, 1994

[87] PCT Pub. No.: WO93/14416

PCT Pub. Date: Jul. 22, 1993

[30] Foreign Application Priority Data

Jan. 13, 1992 [GB] United Kingdom ............... 9200606

[51] Int. Cl.$^6$ .................................................. G01V 3/14
[52] U.S. Cl. .......................................... 324/309; 324/307
[58] Field of Search .................................. 324/309, 307, 324/311, 314

[56] References Cited

U.S. PATENT DOCUMENTS

| | | | |
|---|---|---|---|
| 4,506,223 | 3/1985 | Bottomley | 324/309 |
| 4,691,162 | 9/1987 | Van Uijen | 324/309 |
| 4,812,762 | 3/1989 | Den Boef. | |
| 4,833,411 | 5/1989 | McDonald et al. | 324/309 |
| 4,983,917 | 1/1991 | Le Roux | 324/309 X |
| 5,291,138 | 3/1994 | Macovski | 324/309 |

FOREIGN PATENT DOCUMENTS

| | | |
|---|---|---|
| 0135143 | 3/1985 | European Pat. Off. . |
| 0181015 | 5/1986 | European Pat. Off. . |
| 0259998 | 3/1988 | European Pat. Off. . |

OTHER PUBLICATIONS

D. G. Cory et al, "Communications NMR images . . ." Journal of Magnetic Resonance, 76, (1988), pp. 543–547.

S. P. Cottrell et al, "NMR imaging of solids using large . . ." Measurement Science & Technology, vol. 1, 1990, pp. 624–629.

Primary Examiner—Sandra L. O'Shea
Assistant Examiner—Mack Haynes
Attorney, Agent, or Firm—Nixon & Vanderhye

[57] ABSTRACT

Spatial NMR information is obtained from a sample by applying a magnetic field having a static component and two sinusoidally time varying gradient components ($G_y$, $G_z$), the period of one gradient component ($G_z$) being preferably twice the period of the other gradient component ($G_y$). An RF excitation pulse is applied at the instant both gradient field components are zero. A plurality of NMR sampling responses are produced by gradient echoes in data capture windows and the amplitudes of the gradient field components are varied to provide a desired distribution of sampling path in k-space in each data capture window the gradient field components are reversed in direction to enable all quadrants of k-space to be sampled.

11 Claims, 6 Drawing Sheets

METHOD OF AND APPARATUS FOR OBTAINING SPATIAL NMR INFORMATION

The present invention relates to a method of and apparatus for obtaining spatial nuclear magnetic resonance (NMR) information from a sample, and particularly from a sample having a short (e.g. less than 500 µs) spin-spin relaxation time ($T_2$). In general, solids exhibit such a short $T_2$.

BACKGROUND OF THE INVENTION

The possibility of magnetic imaging in solids has attracted considerable interest recently. NMR imaging in solids is difficult because of the broad NMR lines. One possible approach to the problem is to artificially narrow the line. Such an approach is disclosed in UK Patent Application No. 2234594.

An alternative to line narrowing has been described by Cottrell et al. in their paper entitled "NMR imaging of solids using large oscillating field gradients" (Meas. Sci. Technol. 1, 1990, 624). This paper discloses the use of large oscillating field gradients to dominate the homogeneous dipolar broadening. A single 90° excitation pulse is applied at the time when the field gradient passes through zero and a gradient echo is produced after one complete gradient cycle. Because the 90° pulse is applied at the moment of zero gradient, the RF power requirements are quite modest. The imaging scheme disclosed in this paper used back projection.

Although back projection methods have been conventionally used in solid state NMR imaging, it would be advantageous to use two dimensional Fourier transform (2DFT) techniques since these might be expected to lead to an improvement in image quality.

SUMMARY OF THE INVENTION

According to the present invention, there is provided a method of obtaining spatial NMR information from a sample, comprising:

applying at least one excitation pulse to the sample;

producing a magnetic field in the sample having a static component, and having first and second gradient field components in first and second directions respectively;

controlling the application of the or each excitation pulse and the production of the magnetic field so as to produce a plurality of NMR sampling responses from the sample, the first and second components being so arranged that each sampling response provides a desired sampling path in k-space, the relative amplitudes of such components being so varied over the plurality of the sampling responses as to provide a desired distribution of sampling paths in k-space over said plurality of the sampling responses;

reversing both such components in direction during the occurrence of each sampling response; and detecting each sampling response.

The invention can thus afford a technique which can provide NMR images using 2DFT methods, as is explained below. Further, unlike conventional 2DFT methods, there is no requirement that one gradient component (e.g. a phase encode component) be switched off before the other gradient component (e.g. a frequency encode component) is switched on. Both such components can be run continuously and simultaneously, thus avoiding any problems with spurious eddy current fields due to switching on or off such components.

As is shown in the the paper entitled "A simple graphical representation of Fourier-based imaging methods" by S. Ljunggren (J. Magn. Res. 54 (1983) 338), k-space (the spatial frequency domain) is defined by the following equations:

$$k_y(t) = \gamma \int_0^t G_y(t')dt' \quad (1)$$

$$k_z(t) = \gamma \int_0^t G_z(t')dt' \quad (2)$$

where $G_y$ is the gradient magnetic field component in the y-direction and $G_z$ is the gradient magnetic field component in the z-direction. For a sample which is uniform along x (no slice selection) and for which p (y,z) is the projection of the nuclear spin density onto the y, z plane, the above paper shows that the
Free Induction Decay (f.i.d.) is given by:

$$S(t)=\gamma\int\rho(y,z)\exp[i\{k_y(t)y+k_z(t)z\}]\exp(-t/T_2)dydz \quad (3)$$

In order to reconstruct an NMR image from k-space using 2DFT techniques, information In k-space needs to be sampled on a rectilinear grid. In the present invention, by judicious choice of the waveforms of the first and second gradient components and of the way their relative amplitudes are varied over the plurality of responses, k-space can be sampled as a desired distribution of sampling paths (excursions). This distribution can be discretised into any desired set of distributed sampling points (such as an approximately square or rectangular grid) that is suitable for conversion into a rectilinear grid (e.g. by linearisation and interpolation).

Varying the relative amplitudes of the first and second components can particularly facilitate the provision of a set of distributed sampling points on an approximately rectilinear grid. If the waveforms of such components are regular, and each sampling path is approximately linear, varying the relative amplitudes of such components over the plurality of responses will produce a distribution of parallel sampling paths which can approximate the rectilinear grid. If, in addition, the sampling paths are parallel to one of the k-space axes, a rectilinear grid which Is especially useful for 2DFT methods can be approximated.

The way in which the choice of waveform and the like should be made in order to provide a desired distribution of sampling paths in k-space will be clear to a skilled person, given Equations 1 and 2. It is clear from these equations that k-space sampling paths are a function of the integrals of the first and second gradient field components (e.g. $G_y$ and $G_z$) over time. If, for example, a sampling path is repeated over the plurality of sampling responses with, say, the amplitude of $G_z$ increasing each time so that the level of $k_z$ increases over the plurality of sampling responses then k-space will be sampled in a series of sampling paths of increasing $K_z$.

The NMR sampling responses may, as an example, be f.i.d.'s. However, since an initial portion of the f.i.d. following the application of an excitation pulse is usually lost (with an attendant loss of valuable response information), it is preferred that the NMR sampling responses are echoes. Gradient echoes are particularly preferred, for the following reason. If there is an at least partial reversal of the sampling path (during a sampling response), the general relation, applicable when p(y,z) is real, $$\rho(-k)=\rho^*(k) \quad (4)$$

can be utilised to enable all four quadrants of k-space (rather than just two quadrants) to be sampled, which can lead to time savings of up to a factor of two in a typical experiment. This sampling of the entirety of k-space can be achieved by taking the complex conjugate of the signal after the centre of the sampling response. It will be appreciated that a gradient echo is typically created by a reversal in direction of a gradient component following the application of an excitation pulse. The gradient echo is thus suitably created by the use of a periodic waveform for one or both of the gradient components, since such a waveform gives rise to the necessary reversal. Such a waveform can then be arranged to have a subsequent reversal during the occurrence of the echo, thus giving rise to the at least partial reversal of the sampling path referred to above and enabling all four quadrants of k-space to be sampled via the relation in Equation (4).

By reversing the direction of both the gradient components during the occurrence (preferably at or near the centre) of each sampling response the sampling of k-space during the second half of the response, making use of the relation of Equation 4, (and so covering, e.g., the third and fourth quadrants) can be arranged to be similarly related to that during the first half of the response (covering, e.g., the first and second quadrants). In fact, it is particularly preferred that the first and second components are arranged so that the sampling path during a first portion of each sampling response is retraced during a second portion of each sampling response (thus typically giving rise to a symmetrical echo). The sampling paths In, for example, the third and fourth quadrants can then be identically related by symmetry to the paths in the first and second quadrants.

The waveforms of the first and second components may be periodic, the period of one waveform being an integral multiple of the period of the other, so that the two waveforms can be arranged to have regularly occurring simultaneous zero crossing points, thereby achieving the preferred reversal of both gradient field components referred to above. This arrangement is particularly advantageous if, as is preferred, an excitation pulse is applied at a time when both the gradient field components are approximately zero, since then it can be arranged that a gradient echo forms at a subsequent pair of zero crossing points. Applying an excitation pulse at a time when both the gradient components are approximately zero is preferred since the power requirement on the excitation pulse is at a minimum (for an explanation of which see the Cottrell et al. paper referred to above).

In the preferred embodiment, the waveforms of both such components are sinusoidal or cosinusoidal, the period of one being twice the period of the other, the waveforms having simultaneous zero crossing points. Sinusoidal (or cosinusoidal) waveforms are particularly easy to implement and to synchronise; a factor of two between the waveforms has been found by the inventor to provide a particularly good distribution of sampling points in k-space.

In order to use the information in the responses efficiently it is preferred that the relative amplitudes of the gradient field components are different for each excitation pulse or pulse sequence (such as a line narrowing pulse sequence). If the sample has a short $T_2$, only one response may be detected per excitation pulse or pulse sequence applied. If the $T_2$ is sufficiently long, several responses (e.g. an f.i.d. and a series of echoes) may be detected per excitation pulse or pulse sequence.

The invention extends to apparatus for obtaining spatial NMR information from a sample, comprising:

means for applying at least one excitation pulse to the sample;

means for producing a magnetic field in the sample having a static component, and having first and second gradient field components in first and second directions respectively;

means for controlling the application means and production means so as to produce a plurality of NMR sampling responses from the sample, the first and second components being so arranged that each sampling response provides a desired sampling path in k-space, the relative amplitudes of such components being so varied over the plurality of the sampling responses as to provide a desired distribution of sampling paths in k-space over said plurality of the sampling responses, said controlling means being adapted to reverse both such components in direction during the occurrence of each sampling response; and means for detecting each sampling response.

Further apparatus features analogous to the method features described above are characterised in the dependent apparatus claims.

BRIEF DESCRIPTION OF THE DRAWINGS

Preferred features of the invention are now described, by way of example, with reference to the accompanying drawings, in which:

FIGS. 4 are a $^{19}F$ NMR Image (FIG. 4b) of the PTFE phantom shown In cross-section in FIG. 4a.

DETAILED DESCRIPTION OF THE INVENTION

Figure 1:
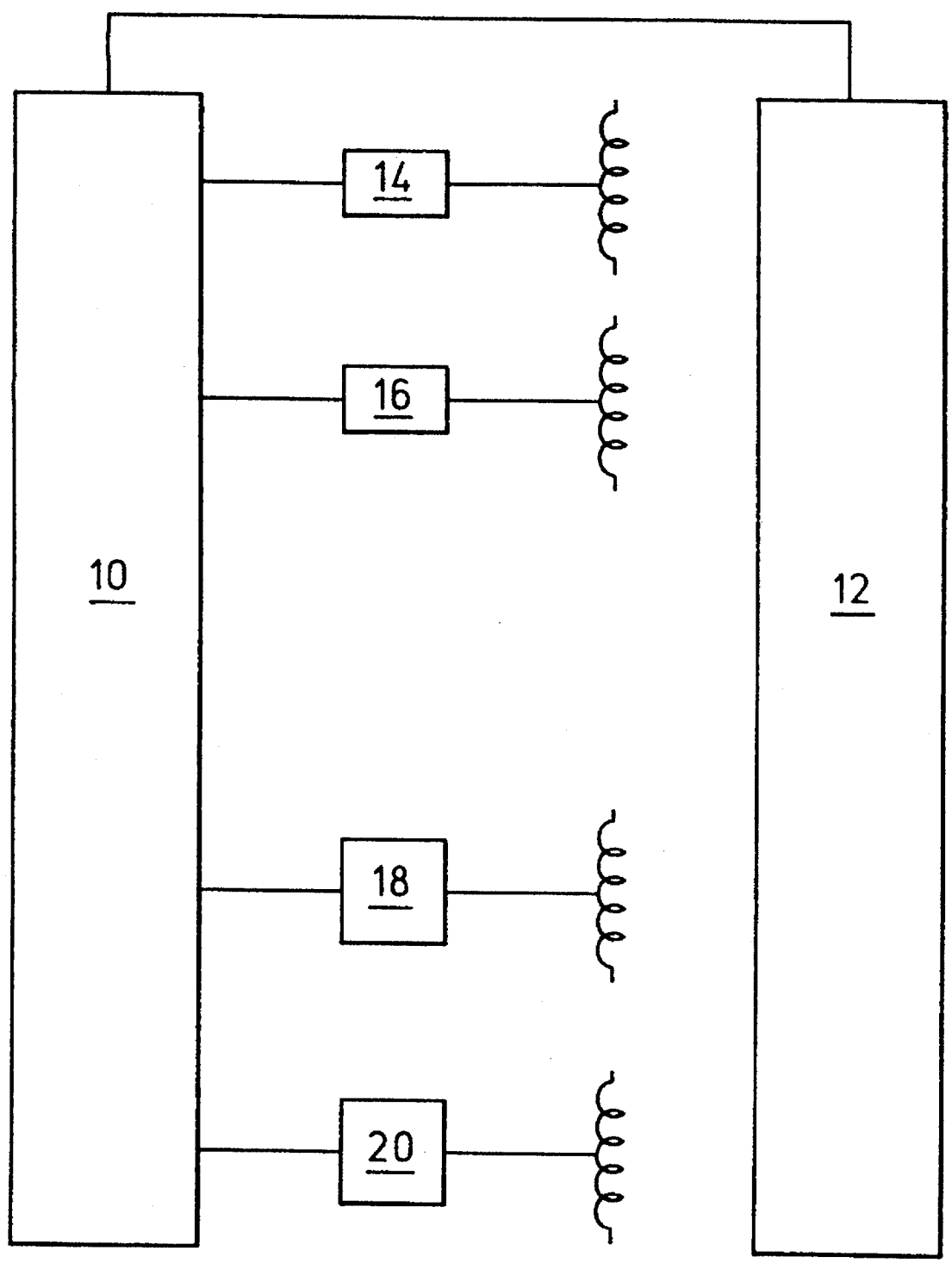
FIG. 1 is a diagrammatic representation of apparatus for obtaining NMR information.

Referring to FIG. 1, NHR imaging apparatus Includes a controller 10, which provides power and control for the other components of the apparatus. The apparatus also includes a magnet 12 for producing a static magnetic field In the object to be imaged, gradient coils 14 and 16 for producing magnetic field gradients $G_y$ and $G_z$ respectively in the y and z directions, an rf transmitter 18, and an rf receiver 20. Apart from the controller 10, the apparatus is conventional and its operation will be well known to the skilled person. It will be appreciated that the controller may in reality consist of various discrete control devices for the various components of the apparatus. In particular, the magnet 12 may be controlled completely separately.

Figure 2:
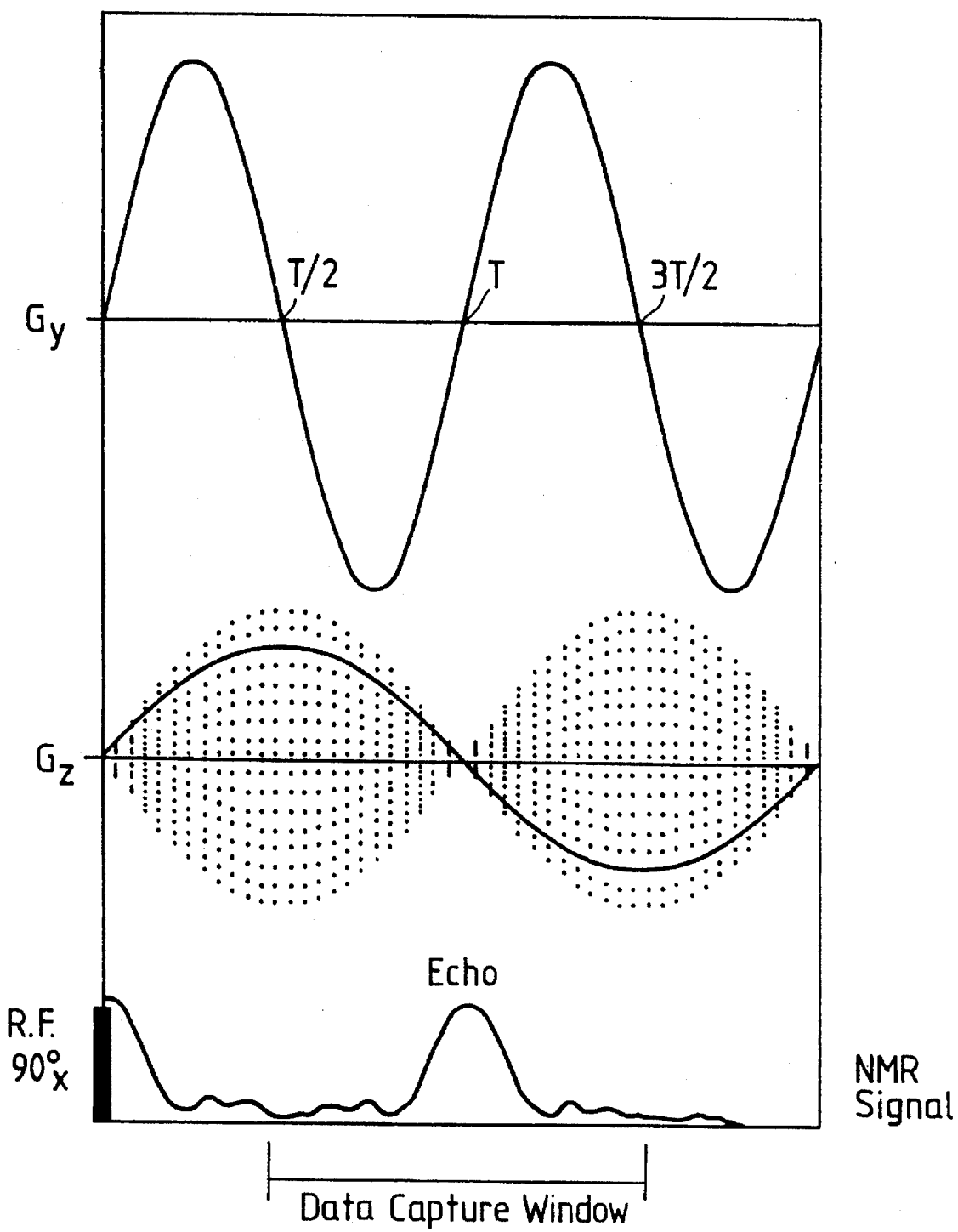
FIG. 2 is a timing diagram illustrating a method of obtaining NMR information.

FIG. 2 illustrates how the controller 10 is configured to produce NNR images using a 2DFT method.

An oscillating field gradient $$G_y(t) = \hat{G}_y \sin(\omega t) \quad (5)$$

is employed in the y direction and an oscillating field gradient of half the frequency, $$G_z(t) = \frac{J}{64} \hat{G}_z \sin\left(\frac{\omega t}{2}\right) \quad (-64 \leq J \leq 64) \quad (6)$$

in the z direction in which the zero to peak amplitude is incremented in 129 steps from $-\hat{G}_z$ to $+\hat{G}_z$. A 90° rf pulse is synchronized to occur at the zero crossing of both gradients, and, after one period $T=2\pi/\omega$ of the $G_y$ gradient, the spins refocus to produce an echo. The echo data (in phase and quadrature) is recorded between T/2 and 3T/2. The timing sequence is then repeated with a repetition time $T_{rep}$ and with a different value of $G_z$ gradient.

Figure 3A:
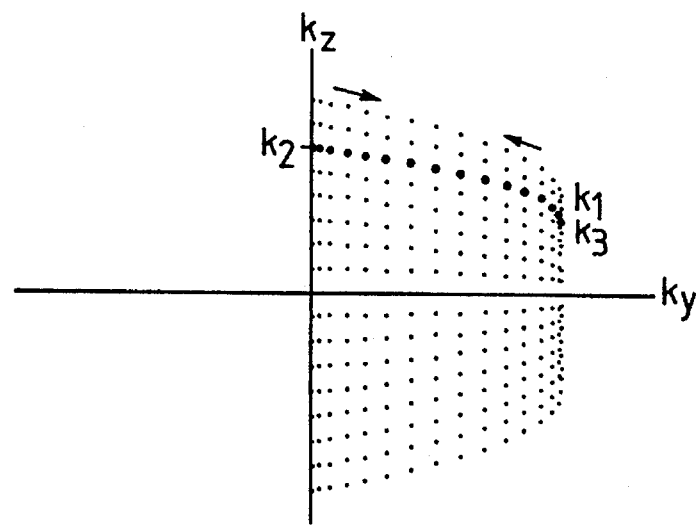
FIGS. 3 are plots of k-space illustrating (a) the sampling path for a gradient echo, (b) the modified path for the echo taking the complex conjugate of the NMR signal after the echo centre, and (c) the modified path for the echo after linearisation in $k_y$ but before linearisation in $k_z$.

As can be seen from Equations 1 and 2, the effect of keeping the amplitude of $G_y$ constant for each repetition of the timing sequence, but varying the amplitude of $G_z$, is that successive echoes have the same $k_y$ trajectory but their $k_z$ trajectories are displaced. FIG. 3a shows the coverage in k-space from T/2 to 3T/2. In this figure, $k_1$ corresponds to T/2, $k_2$ corresponds to T (at the centre of the echo), and $k_3$ corresponds to 3T/2.

According to Equation 1, the maximum value of $k_y$ occurs at $t=T/2$ and is given by $$k_y(T/2) = \gamma \int_0^{T/2} G_y(t)dt = \gamma \int_0^{T/2} \hat{G}_y \sin(\omega t)dt = \gamma \hat{G}_y T/\pi \quad (7)$$

Similarly from Equation 2, the maximum value of $K_z$ occurs when $|J|=64$ and $t=T$. Thus $$[k_z(T)]_{max} = \quad (8)$$

$$\left[\gamma \int_0^T G_z(t)dt\right]_{|J|=64} = \gamma \int_0^T \hat{G}_z \sin\left(\frac{\omega}{2} t\right)dt = \gamma \hat{G}_z T/2\pi$$

Comparing Equations 7 and 8, the same excursion in both $k_y$ and $k_z$ is obtained if $$\hat{G}_z = \frac{\hat{G}_y}{2} \quad (9)$$

Figure 3B:
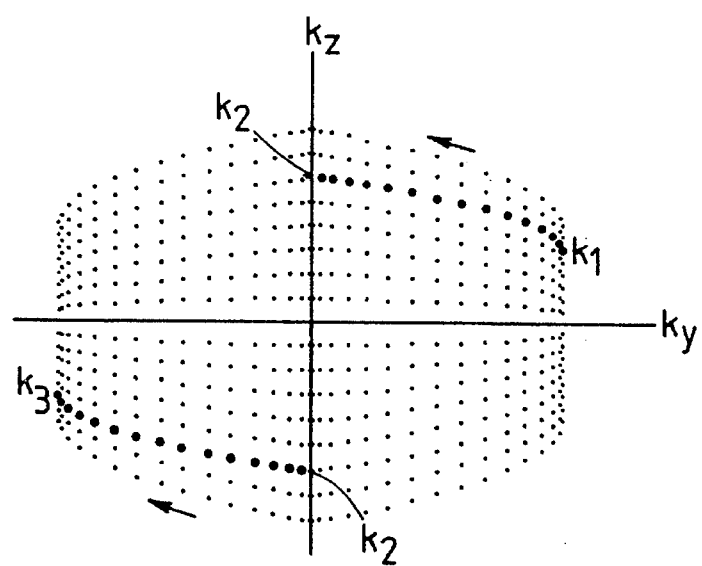

Because the echo is formed by reversing the gradient, and not by a 180° pulse, the k-space sampling only covers two quadrants. In order to cover all four quadrants, use is made of the general. relation in Equation 4, applicable when p(y,z) is real. Thus if the complex conjugate of the signal after the echo centre (t=T) is taken, the k-space sampling will now cover the other two quadrants, as shown in FIG. 3b.

As oscillating field gradients are used, k-space is not sampled uniformly and a procedure must be used in order to correct for the variation in the field gradients during data collection and convert the sampling to uniform (i.e. rectilinear grid) sampling. Linearisation is therefore carried out both in $k_y$ and in $k_z$. Regarding linearisation in $k_y$, referring to FIG. 3b, consider the part of the echo from t=T to t=3T/2, in particular the trajectory along $k_y$. Since the effect of a constant gradient, $G_{yo}$, is to produce equal increments in $k_y$, data recorded at a time t=T+t' (i.e. t' after the echo centre) with the oscillating gradient can be corrected to data recorded at a time t=T+t" in a constant gradient. Linearisation consists of solving the following equation:

$$k_y(G_{yo}(T+t")) = k_y(G_y(T+t')) \quad (10)$$

i.e. $\gamma \int_0^{T+t"} G_{yo}dt = \gamma \int_0^{T+t'} G_y \sin(\omega t)dt$ If we choose $$\hat{G}_{yo} = \frac{2}{\pi} \hat{G}_y$$

then the $k_y$ maximum excursion at $t=T/2$ will be the same in both cases. Thu $$G_{yo} t" = G_y \left[\frac{1-\cos\omega t'}{\omega}\right] \quad (11)$$

$$t' = \frac{1}{\omega} \cos^{-1}\left(1 - \frac{2}{\pi} t"\omega\right)$$

Simple linear interpolation is used to generate the new data set. The coverage of k-space after linearisation in $k_y$ is shown schematically in FIG. 3c.

Figure 3C:
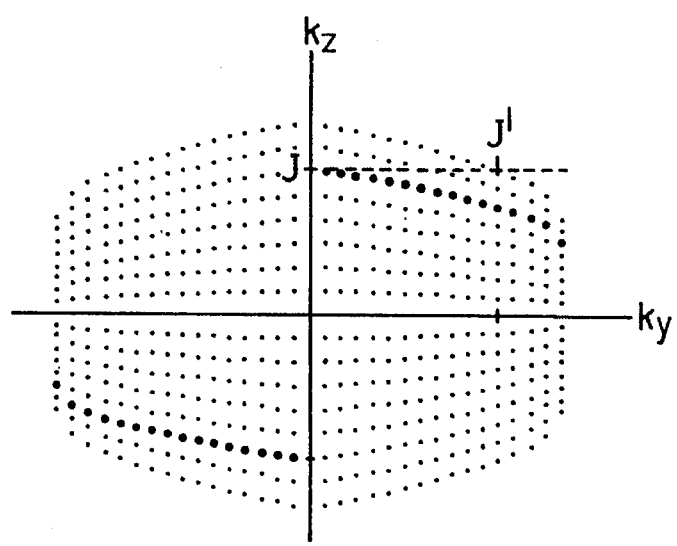

Regarding linearisation in $K_z$, as can be seen from FIG. 3c, a typical sampling path for constant J (from Equation 6) results in a decrease in $K_z$ as $|k_y|$ increases. In order to follow a horizontal path in which $k_z$ remains constant, the index J must be increased with $|k_y|$. This is indicated as J' in FIG. 3c. Thus from Equations 2 and 6, for a given J, the value of $k_z$ at the centre of the echo (t=T) is given by $$k_z(t) = \gamma \int_0^T \frac{J}{64} \hat{G}_z \sin\frac{\omega t}{2} dt = \frac{2T\gamma J \hat{G}_z}{64\pi} \quad (12)$$

At a time $t=T+t'$, i.e. t' after the echo centre, the value of $k_z$ for $G_z$ index J' is given by $$k_z(T+t') = \gamma \int_0^{T+t'} \frac{J'}{64} \hat{G}_z \sin\frac{\omega t}{2} dt \quad (13)$$

$$= \gamma \frac{J'}{64} \hat{G}_z \frac{T}{\pi} \left[1 + \cos\frac{\pi t'}{T}\right] \quad (14)$$

Thus if $k_z$ is to remain constant, then, from Equations 12 and 14, J and J' are related by the condition $$J' = \frac{2J}{\left[1 + \cos\frac{\pi t'}{T}\right]} \quad (15)$$

Since we have chosen to perform the linearisation in $k_z$ after the linearisation in $k_y$, it Is more convenient to express Equation 15 in terms of t" rather than in terms of t'. Thus, using Equation 11, Equation 15 becomes $$J' = \frac{2J}{1 + \left(1 - \frac{2|t"|}{T}\right)^{1/2}} \quad (16)$$

For example if t=1.333T, then t'=0.333T, t"=0.375T and $|k_y|=0.75k_{ymax}$ as indicated by the mark on the $k_y$ axis in FIG. 3c. Thus if J=28 then, from either Equation 15 or Equation 16, J'=37.333. A simple linear interpolation is again used between echo data sets 37 and 38.

EXAMPLE

An experiment was carried out using a 0.5T electromagnet (21.4 Mhz) as the magnet 12. The design of the gradient coils 14 and 16 was based on the work of Zupancic and Pirs (J. Phys. E: Sci. Instrum. 9, (1976), 79) and provided 30G/cm/A in both the y and z directions. The home built rf transmitter 18 and receiver 20 consisted of inductively coupled 'transmit' and 'receive'coils. The rf pulse strength was 2mT ($t_{90}$=3 μsec) and the receiver dead time after the rf pulse was 8 μsec. A LeCroy 9400 (Trade Mark) storage oscilloscope was used as part of the controller 10 for data capture and averaging. The controller also included two sine wave oscillators which were used to produce the oscillating gradients, with the $G_z$ oscillator locked to half the frequency of the $G_y$ oscillator using synchronizing pulses from a zero crossing detector. The output of each oscillator was multiplied by the output of a 12 bit DAC controlled by an Acorn Archimedes (Trade Mark) computer. A SMIS (Trade Mark) pulse programmer, again as part of the controller 10, was used for all the timing and control. The averaged echo data from the LeCroy oscilloscope was transferred to the Archimedes computer via the IEEE bus. The skilled person will, of course, be aware of other types and makes of suitable equipment.

Figure 4A:
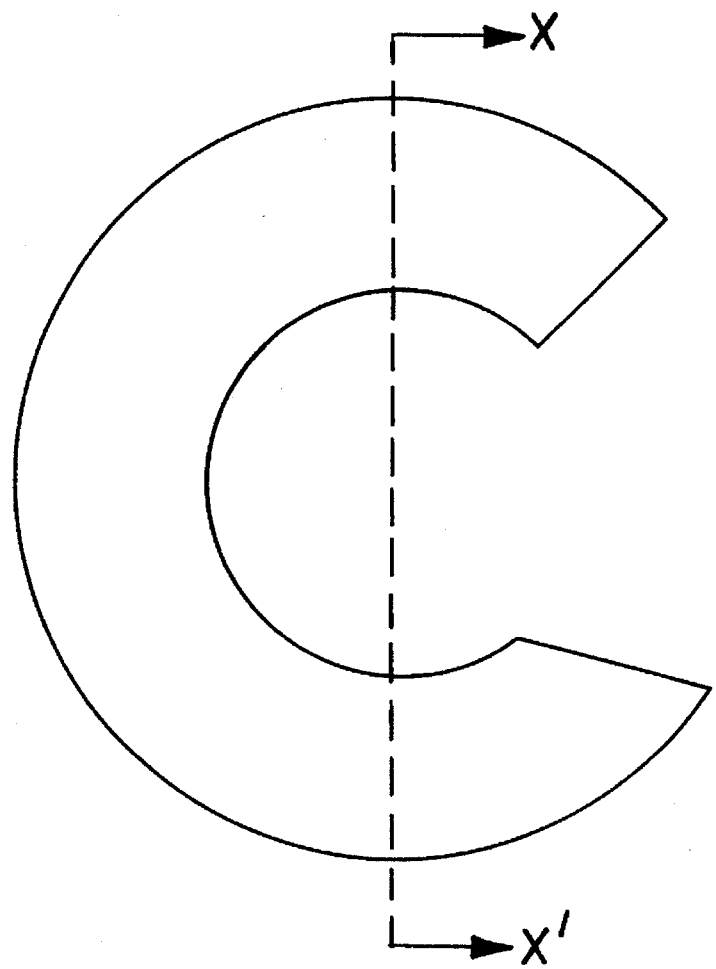
Figure 4B:
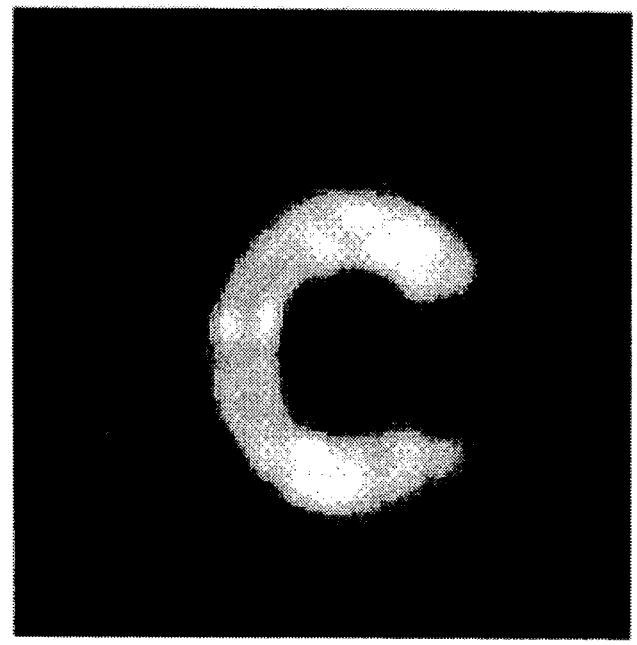
Figure 4C:
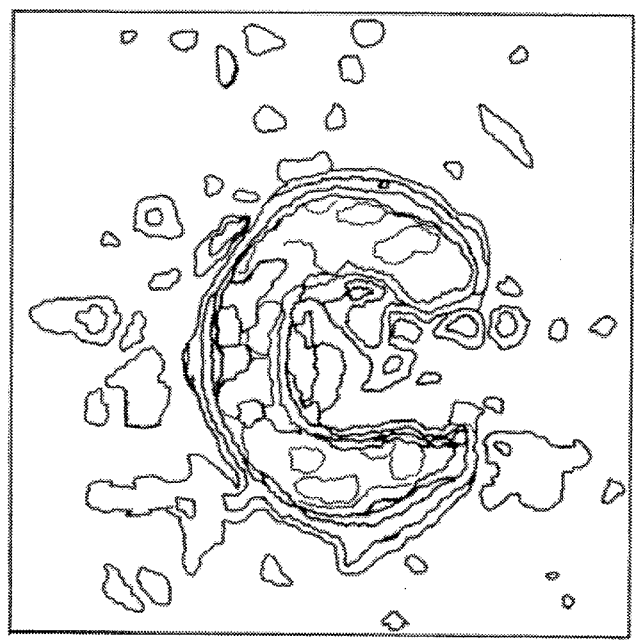

FIG. 4b shows a two-dimensional $^{19}$F image of a PTFE phantom with a $T_2$ of about 60 μsec obtained using the method and apparatus of the present invention. The phantom, in the shape of a cylinder with a section removed, was 6 mm in diameter and 4 mm in length, as shown in FIG. 4a. The image was obtained with a Gy gradient of 120 G/cm peak (4 A peak) while the $G_z$ gradient was varied in 129 steps spanning ±60 G/cm peak (2 A peak). The frequencies of the $G_y$ and $G_z$ gradients were 19.5 kHz and 9.75 kHz respectively. Echo data was recorded with a repetition time $T_{rep}$ of 150 msec with 50 averages. The total imaging time was 26 minutes.

Figure 5:
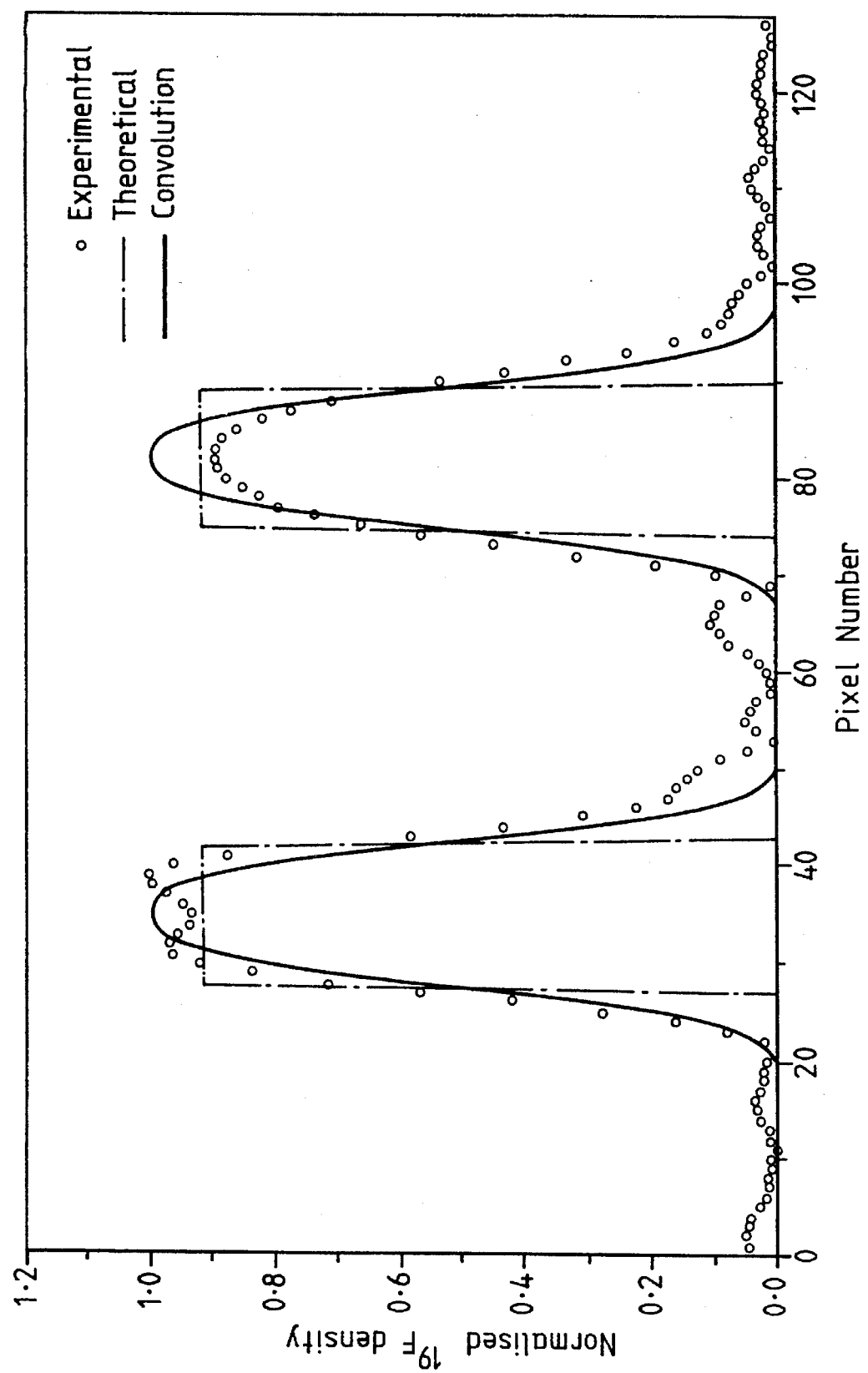
FIG. 5 is a plot of normalised $^{19}F$ density against pixel number for a cross-section of the PTFE phantom taken along the line XX' shown In FIG. 4, showing a comparison between experimental and theoretical results.

Referring now to the comparison of the experimental (shown by discrete data points) and theoretical (shown by chain-dotted lines) profiles shown in FIG. 5, by convolution of the theoretical profile with a Gaussian $\exp(-x^2/a^2)$ to produce a convolution profile (see the full lines), the resolution In FIG. 4a was estimated to be (full width at half height) 1.66a≈0.7 mm. The experimental resolution depends on two factors. The first factor is the ratio of the spectral width of the signal to the natural line width. The second factor is the truncation effect caused by the finite data capture window from T/2 to 3T/2 equal to one period of the oscillating gradient $G_y$. In the present experiment the total resolution has been predicted to be 0.8 mm, and is thus in reasonable agreement with the experimental estimate of 0.7 mm.

It will of course be understood that the present invention has been described purely by way of example, and modifications of detail can be made within the scope of the invention.

I claim:

1. A method of obtaining spatial NMR information from a solid sample, comprising the steps of:

applying at least one excitation pulse to the sample;

producing a magnetic field in the sample having a static component, and having first and second gradient field components in first and second directions respectively;

controlling application of the or each excitation pulse and the production of said magnetic field so as to produce a plurality of NMR sampling responses from the sample, each sampling response providing a desired sampling path in k-space;

varying the relative amplitudes of said first and second gradient field components over said plurality of sampling responses so as to provide a desired distribution of sampling paths in k-space over said plurality of sampling responses;

reversing both said first and second gradient field components in direction during the occurrence of each sampling response; and detecting each sampling response, said first and second gradient field components each having a periodic waveform, the period of one waveform being an integral multiple n of the other, where n is greater than 1.

2. A method according to claim 1, wherein the NMR sampling responses are echoes.

3. A method according to claim 1, wherein said components are arranged so that the sampling path during a first portion of each sampling response is retraced during a second portion of each sampling response.

4. A method according to claim 1, wherein an excitation pulse is applied at a time when both said components are approximately zero.

5. A method according to claim 1, wherein the waveforms of both said components are sinusoidal, the period of one being twice the period of the other, the waveforms having simultaneous zero crossing points.

6. A method according to claim 1, wherein the relative amplitudes of said components are different for each excitation pulse or pulse sequence.

7. A method according to claim 1, wherein one response is detected per excitation pulse or pulse sequence applied.

8. Apparatus for obtaining spatial NMR information from a solid sample, comprising:

application means for applying at least one excitation pulse to the sample;

production means for producing a magnetic field in the sample having a static component, and having first and second gradient field components in first and second directions respectively;

controlling means for controlling said application means and production means so as to produce a plurality of NMR sampling responses from the sample, each sampling response providing a desired sampling path in k-space, the relative amplitudes of said first and second gradient filed components being varied over said plurality of sampling responses so as to provide a desired distribution of sampling paths in k-space over said plurality of sampling responses, said controlling means reversing both said first and second gradient field components in direction during the occurrence of each sampling response; and means for detecting each sampling response, said first and second gradient field components each having a periodic waveform, the period of one waveform being an integral multiple n of the other, where n is greater than 1.

9. Apparatus according to claim 8, wherein said components are arranged so that the sampling path during a first portion of each sampling response is retraced during a second portion of each sampling response.

10. Apparatus according to claim 8, wherein said controlling means applies an excitation pulse at a time when both such components are approximately zero.

11. Apparatus according to claim 8, wherein said controlling means is arranged such that the waveforms of both said first and second components are sinusoidal or cosinusoidal, the period of one being twice the period of the other, the waveforms having simultaneous zero crossing points.

\* \* \* \* \*